United States Patent
Reiss et al.

(10) Patent No.: US 10,992,449 B1
(45) Date of Patent: Apr. 27, 2021

(54) ENCODING AND STRIPING TECHNIQUE FOR DC BALANCING IN SINGLE-ENDED SIGNALING

(71) Applicant: Cadence Design Systems, Inc., San Jose, CA (US)

(72) Inventors: Loren B. Reiss, Raleigh, NC (US); Fred Staples Stivers, Raleigh, NC (US); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/940,343

(22) Filed: Jul. 27, 2020

(51) Int. Cl.
| | |
|---|---|
| *H04K 1/10* | (2006.01) |
| *H04L 27/28* | (2006.01) |
| *H04L 7/00* | (2006.01) |
| *H04L 7/02* | (2006.01) |
| *G06F 9/30* | (2018.01) |

(52) U.S. Cl.
CPC ........ *H04L 7/0087* (2013.01); *G06F 9/30029* (2013.01); *G06F 9/30087* (2013.01); *G06F 9/30134* (2013.01); *H04L 7/0008* (2013.01); *H04L 7/02* (2013.01)

(58) Field of Classification Search
CPC ....... H04L 7/0087; H04L 7/02; H04L 7/0008; H04L 1/24; H04L 25/4908; H04L 1/0041; H04L 1/0069; G06F 9/30134; G06F 9/30087; G06F 9/30029; G06F 13/4278; H03M 5/04; H03M 9/00; H03M 5/20; H04J 3/1611

USPC .......................................... 375/260, 292, 295
See application file for complete search history.

(56) References Cited

U.S. PATENT DOCUMENTS

| | | | | |
|---|---|---|---|---|
| 5,598,442 A | * | 1/1997 | Gregg ................. | G06F 13/4278 370/514 |
| 6,167,077 A | * | 12/2000 | Ducaroir ................... | H04L 1/24 370/476 |
| 6,496,540 B1 | * | 12/2002 | Widmer ................... | H03M 5/04 341/59 |
| 2002/0075903 A1 | * | 6/2002 | Hind ...................... | H04J 3/1611 370/503 |
| 2003/0081576 A1 | * | 5/2003 | Kim ...................... | H04L 1/0069 370/335 |
| 2005/0201162 A1 | * | 9/2005 | Shibata .................. | H03M 9/00 365/189.05 |
| 2006/0209813 A1 | * | 9/2006 | Higuchi ................ | H04L 1/0041 370/366 |
| 2011/0109484 A1 | * | 5/2011 | Sugita ..................... | H03M 5/20 341/55 |
| 2013/0127645 A1 | * | 5/2013 | Shibata ................... | H03M 9/00 341/100 |

(Continued)

*Primary Examiner* — Phuong Phu

(74) *Attorney, Agent, or Firm* — Schwegman Lundberg & Woessner, P.A.

(57) ABSTRACT

A set of encoders within a transmitter (TX) physical layer (PHY) encode incoming data using a predefined encoder scheme by translating multiple data segments into a set of balanced bit sequences. Each data segment comprises a first number of bits and each balanced bit sequence comprises a second number of bits. A data striping component distributes the set of balanced bit sequences to a set of serializers by routing bits from particular bit positions in each balanced bit sequence to a corresponding serializer. The set of serializers generates serialized data based on the set of balanced bit sequences.

20 Claims, 5 Drawing Sheets

(56) References Cited

U.S. PATENT DOCUMENTS

2013/0223552 A1* 8/2013 Okada ................ H04L 25/4908
                                                    375/267
2021/0013998 A1* 1/2021 Sun ........................ H03M 9/00

* cited by examiner

ENCODING AND STRIPING TECHNIQUE FOR DC BALANCING IN SINGLE-ENDED SIGNALING

TECHNICAL FIELD

The present disclosure generally relates to integrated circuits (ICs). In particular, the present disclosure addresses data encoding and striping techniques for providing direct current (DC) balancing in single-ended signaling.

BACKGROUND

Single-ended signaling is a common method of transmitting electrical signals over wires. With single-ended signaling, also referred to as non-differential signaling, one wire carries a varying voltage that represents the signal and another wire is connected to a reference voltage, usually ground. A disadvantage of single-ended signaling is that the return currents for all the signals use the same conductor and this can sometimes cause interference ("crosstalk") between the signals, which results in noise being introduced in the signals, thereby reducing the reliability of the signal transmission.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
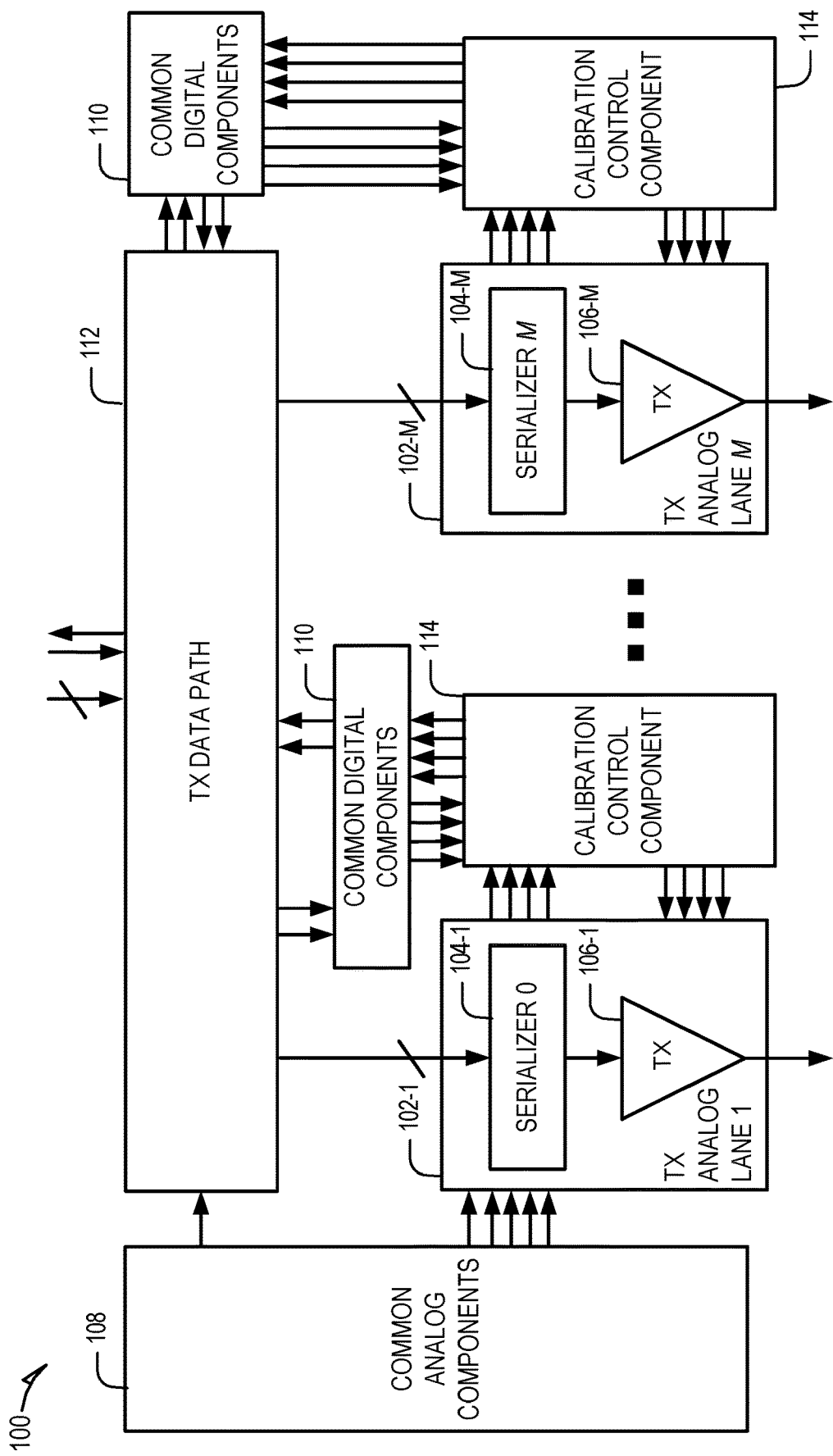
FIG. 1 is a block diagram illustrating a transmitter (TX) physical layer (PHY), according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure address systems, methods, devices, and circuits to address the above referenced problems in single-ended signaling, among others, through temporal direct current (DC) balancing of transmitted (TX) signals. TX signals are DC balanced using a data encoding and striping scheme in which segments of data are translated into encoded symbols and the encoded symbols are striped along a set of serializers prior to transmission.

Consistent with some embodiments, DC balanced serial data is instantaneously transmitted across multiple communication lanes. As used herein, data (e.g., a bit sequence or bit symbol) indicated as being "DC balanced" refers to a ratio of a number of high state bits (1s) and a number of low state bits (0s) in the data bit sequence being no greater than 2. In an example, single-ended signaling is performed on 7 communication lanes using 6-bit/7-bit encoding of data. In this example, 32 encoders are used to encode a 192-bit data word that is to be transmitted. Each encoder translates a 6-bit segment of the data word into a 7-bit symbol that is DC balanced. In other words, each 7-bit symbol includes either four 1s and three 0s or three 1s and four 0s. That is, in the context of this particular example, the number of high state bits (1s) and a number of low state bits (0s) in each balanced bit sequence is no greater than 1 thus satisfying the constraint for a DC balanced bit sequence.

Each bit of a 7-bit encoded symbol is routed to a different serializer (a serializer is included in each communication lane). For example, a first serializer receives a bit in a first bit position of each encoded bit sequence, a second serializer receives a bit in a second bit position of each encoded bit sequence, and so forth until the last serializer receives a bit in a last bit position of each encoded bit sequence. Each serializer transmits bit 0 of the 32-bit parallel data word it receives first and bit 31 last. Thus, the combination of the 6-bit/7-bit encoding scheme and mapping each bit to a different serializer provides instantaneous DC balancing on single-ended serial TX data.

With reference to FIG. 1, a TX PHY 100 for serial data transfer is illustrated, according to some example embodiments. The TX PHY 100 includes multiple analog TX lanes 102-1 to 102-M. Each analog TX lane 102-1 to 102-M includes a serializer to serialize incoming data for transmission and a transmitter to transmit the serialized data. For example, as shown, the TX PHY 100 includes serializers 104-1 to 104-M and transmitters 106-1 to 106-M. Each of the transmitters 106-1 to 106-M transmits serialized data to a corresponding analog receiver (RX) lane in a linked RX PHY device.

Each of the TX analog lanes of the TX PHY 100 are coupled to common analog components 108 and common digital components 110. The common analog components 108 can, for example, include a phase locked loop (PLL) circuit, a bandgap circuit, and a high-speed clock distribution network. The common digital components 110 can include a start-up state machine to define behavior of the TX PHY 100 at start-up (e.g., executing a calibration sequence), a PLL calibration component, a bandgap calibration component, and a TX clock calibration component. A TX data path 112 of the TX PHY 100 may include a scrambler component, a DC balancing sub-system, an encoded data interleaving component, a built-in self-test (BIST) pattern generation component, and a loopback BIST data capture and checking component.

The TX PHY 100 further includes a calibration control component 114 to control execution of a calibration sequence within the TX PHY 100 to ensure reliable data transmission. The calibration sequence includes a set of calibration functions that are sequentially executed. Each calibration function is performed by a calibration component such as the PLL calibration component, bandgap calibration component, and TX clock calibration component referenced above. To execute a particular calibration function within the calibration sequence, the calibration control component 114 sends a control signal to the corresponding calibration component.

Figure 2:
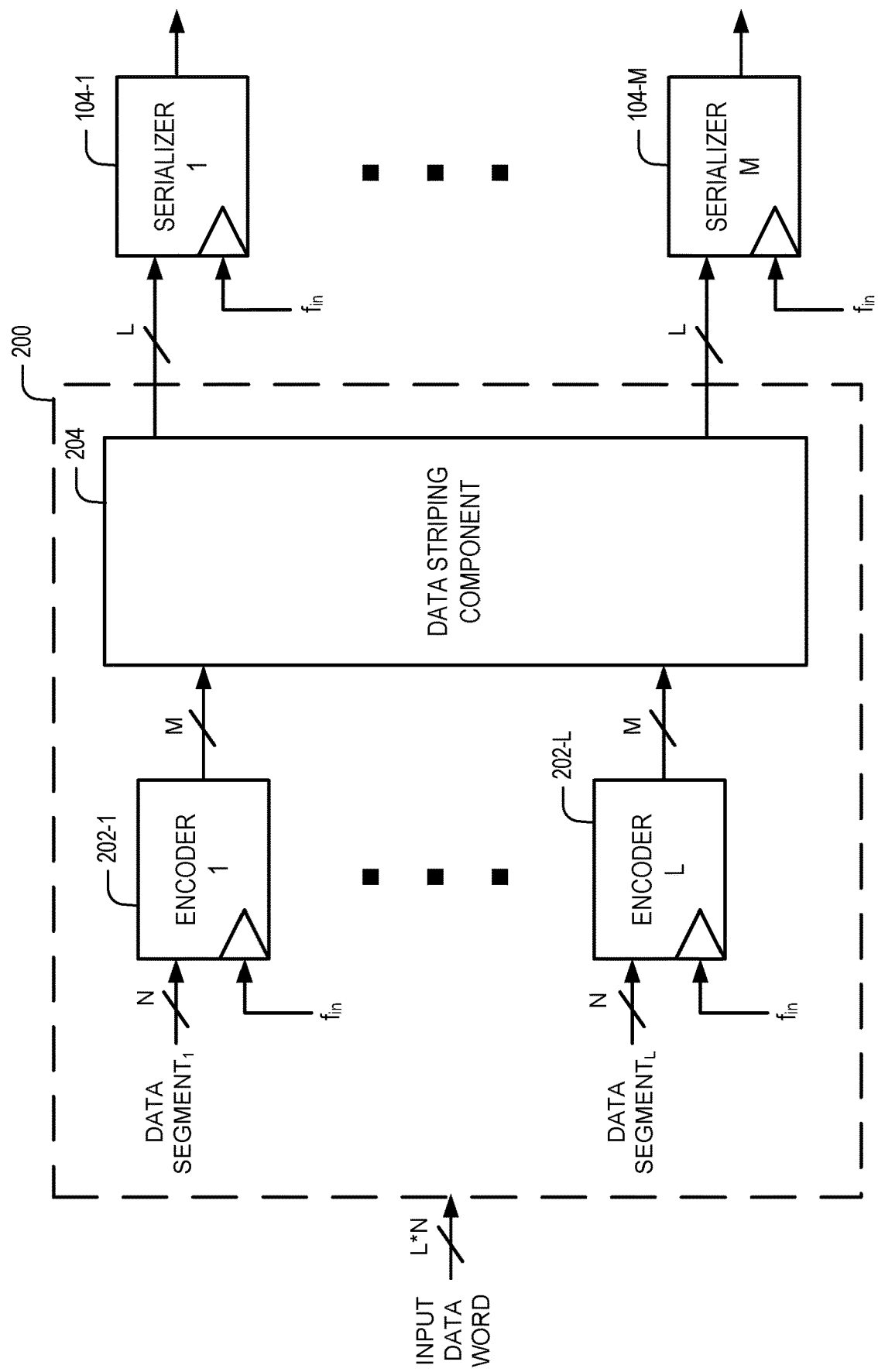
FIG. 2 is a block diagram illustrating a DC balancing sub-system in a data path of the TX PHY, according to some example embodiments.

FIG. 2 is a block diagram illustrating a DC balancing sub-system 200 in the data path 112 of the TX PHY 100, according to some example embodiments. The data path 112 of the TX PHY 100 can include an instance of the DC balancing sub-system 200 for each of the analog TX lanes 102-1 to 102-M. As shown, the DC balancing sub-system includes encoders 202-1 to 202-L and a data striping component 204.

Incoming parallel data to be transmitted is segmented into multiple data segments (data segment$_1$-data segment$_L$) and each of the encoders 202-1 to 202-L receives one of the data segments. In an example, the incoming parallel data is a 192-bit parallel data word that is segmented into 32 6-bit data segments, each of which are provided to one of the encoders 202-1 to 202-L. Thus, in this example, L is 32, M is 7, and N is 6.

Each of the encoders 202-1 to 202-L encodes a data segment using a predefined encoder scheme. The predefined encoder scheme comprises a mapping between a set of unencoded bit sequences and a set of encoded bit sequences. Each unencoded bit sequence includes N bits while each encoded bit sequence includes M bits. Consistent with some embodiments, M=N+1. Returning to the example above, the predefined encoder scheme includes a mapping between 6-bit unencoded bit sequences and 7-bit encoded bit sequences. Table 1, presented below, provides an example encoder mapping to further the 6-bit/7-bit encoding scheme.

TABLE 1

| 6-bit data | 7-bit symbol | 6-bit data | 7-bit symbol | 6-bit data | 7-bit symbol | 6-bit data | 7-bit symbol |
|---|---|---|---|---|---|---|---|
| 0x00 | 0x07 | 0x10 | 0x25 | 0x20 | 0x3C | 0x30 | 0x59 |
| 0x01 | 0x0B | 0x11 | 0x26 | 0x21 | 0x43 | 0x31 | 0x5A |
| 0x02 | 0x0D | 0x12 | 0x27 | 0x22 | 0x45 | 0x32 | 0x5C |
| 0x03 | 0x0E | 0x13 | 0x29 | 0x23 | 0x46 | 0x33 | 0x61 |
| 0x04 | 0x0F | 0x14 | 0x2B | 0x24 | 0x49 | 0x34 | 0x62 |
| 0x05 | 0x13 | 0x15 | 0x2C | 0x25 | 0x4A | 0x35 | 0x63 |
| 0x06 | 0x15 | 0x16 | 0x2D | 0x26 | 0x4B | 0x36 | 0x64 |
| 0x07 | 0x16 | 0x17 | 0x2E | 0x27 | 0x4C | 0x37 | 0x65 |
| 0x08 | 0x17 | 0x18 | 0x31 | 0x28 | 0x4D | 0x38 | 0x66 |
| 0x09 | 0x19 | 0x19 | 0x32 | 0x29 | 0x4E | 0x39 | 0x68 |
| 0x0A | 0x1A | 0x1A | 0x33 | 0x2A | 0x51 | 0x3A | 0x69 |
| 0x0B | 0x1B | 0x1B | 0x34 | 0x2B | 0x52 | 0x3B | 0x6A |
| 0x0C | 0x1C | 0x1C | 0x35 | 0x2C | 0x53 | 0x3C | 0x6C |
| 0x0D | 0x1D | 0x1D | 0x36 | 0x2D | 0x54 | 0x3D | 0x70 |
| 0x0E | 0x1E | 0x1E | 0x39 | 0x2E | 0x56 | 0x3E | 0x71 |
| 0x0F | 0x23 | 0x1F | 0x3A | 0x2F | 0x58 | 0x3F | 0x72 |

With reference to the example encoder mapping provided by Table 1, there are 64 6-bit data words (6-bit unencoded bit sequences). For DC balancing, there are 70 7-bit symbols (7-bit encoded bit sequences). That is, there are 70 7-bit sequences with either three is and four 0s or four is and three 0s. Hence, the number of high state bits (1s) and a number of low state bits (0s) in each balanced bit sequence is no greater than one.

One of ordinary skill in the art will appreciate that there are 6 'extra' DC balanced 7-bit symbols: 0x2A, 0x55, 0x38, 0x47, 0x74 and 0x78. Any one or more of these extra symbols can be unused or designated as K-character codes. K-character codes are used during the transmission of calibration patterns and when there is not a valid 192-bit parallel data word to transmit. When there is not a valid 192-bit parallel data word to transmit, a "bubble" in the form of one of the K-character codes is transmitted.

Each encoded bit sequence is a DC balanced bit sequence. Hence, in encoding a data segment, an encoder translates a given data segment into a balanced bit sequence. Each of the encoders 202-1 to 202-L provides an encoded bit sequence at its output to the data striping component 204. Collectively, the set of encoders 202 outputs a set of encoded bit sequences to the data striping component 204. Continuing the example from above, given that there are 32 encoders 202, the DC balancing sub-system 200 generates 32 encoded bit sequences.

The data striping component 204 distributes the set of encoded bit sequences to serializers in the analog TX lanes 102-1 to 102-M (serializers 104-1 to 104-M). In distributing the set of encoded bit sequences, the data striping component 204 routes one bit from each encoded bit sequence to a particular one of the serializers 201-1 to 201-M.

Figure 3:
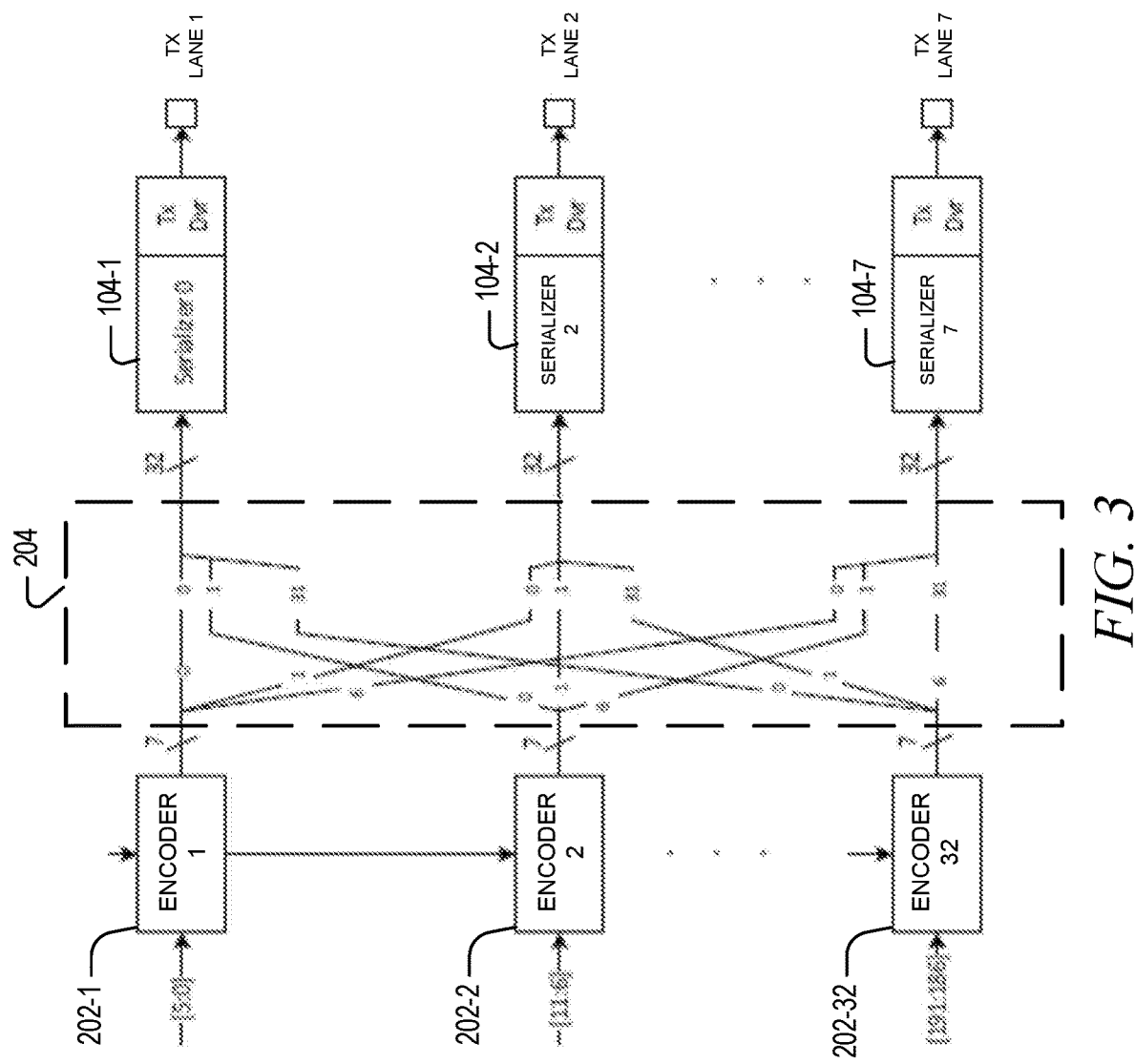
FIG. 3 is a conceptual diagram illustrating a process of data striping within the data path of the TX PHY, according to some example embodiments.

FIG. 3 illustrates an example data striping scheme used by the data striping component 204 to distribute the set of encoded bit sequences to the serializers in each of the analog TX lanes 102-1 to 102-M of the TX PHY 100, according to some example embodiments. In the example illustrated in FIG. 3, L is 32, M is 7, and N is 6

As shown, each serializer 104-1 to 104-7 is designated to receives bits from a particular bit position within each of the encoded bit sequences. That is, serializer 104-1 receives a bit in a first bit position (illustrated as "0") of each encoded bit sequences, serializer 104-2 receives a bit in a second bit position (illustrated as "1") of each encoded bit sequences, and so forth. Each serializer 104-1 to 104-M collectively receives an interleaved bit sequence comprising bits from a particular position in each of the encoded bit sequences. Each serializer 104-1 to 104-M serializes the received interleaved bit sequence, and the serialized data is transmitted by a corresponding transmitter in the analog TX lane.

As illustrated in FIG. 3, the data striping component 204 routes: bits in the first bit position of each encoded 7-bit sequence to serializer 104-1; bits in the second bit position of each encoded 7-bit sequence to serializer 104-2; bits in the third bit position of each encoded 7-bit sequence to serializer 104-3; bits in the fourth bit position of each encoded 7-bit sequence to serializer 104-4; bits in the fifth bit position of each encoded 7-bit sequence to serializer 104-5; bits in the sixth bit position of each encoded 7-bit sequence to sixth serializer 104-6; and the bit in the seventh bit position of each encoded 7-bit sequence to serializer 104-7. Given that there are 32 encoded bit sequences in this example, each serializer 104-1 to 104-7 receives and serializes an interleaved 32-bit sequence comprising a bit from each of the 32 encoded bit sequences. Each serializer 104-1 to 104-7 transmits the 32-bit sequence in order such that the bit in first bit position of the interleaved bit sequence is transmitted first and the bit in the last position of the interleaved bit sequence is transmitted last.

Figure 4:
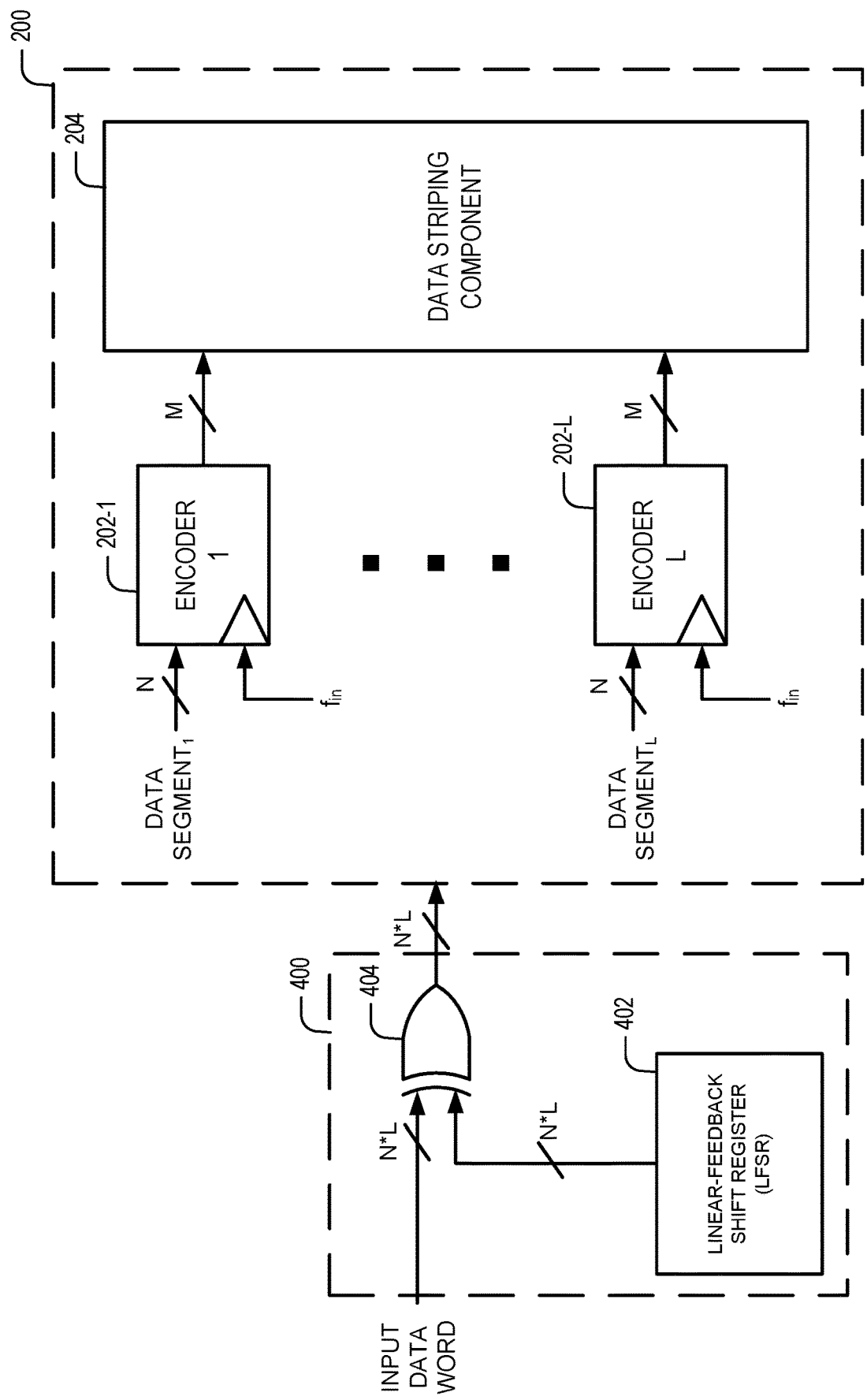
FIG. 4 is a block diagram illustrating a scrambler included in the data path of the TX PHY, according to some example embodiments.

To ensure that each receiver lane periodically observes a rising or falling edge on incoming serial data, the incoming data to be transmitted can be scrambled prior to encoding. FIG. 4 is a block diagram illustrating a scrambler 400 that can be included in the data path 112 of the TX PHY 100 to scramble data prior to encoding, according to some example embodiments. As shown in FIG. 4, the scrambler 400 comprises a linear-feedback shift register (LFSR) 402 and an exclusive or (XOR) gate 404. Incoming data is scrambled by using the XOR gate 404 to perform an XOR on each bit of incoming data with an associated bit from the LFSR 402. Consistent with some embodiments, the LFSR 402 is implemented based on the following polynomial:

$$x^{192}+x^{190}+x^{178}+x^{177}+1$$

The LFSR 402 is advanced by a predetermined number of bits (e.g., 192-bits) each clock cycle and has a starting seed of all ones. Scrambling can be disabled by forcing all LFSR 402 bits to zero.

Figure 5:
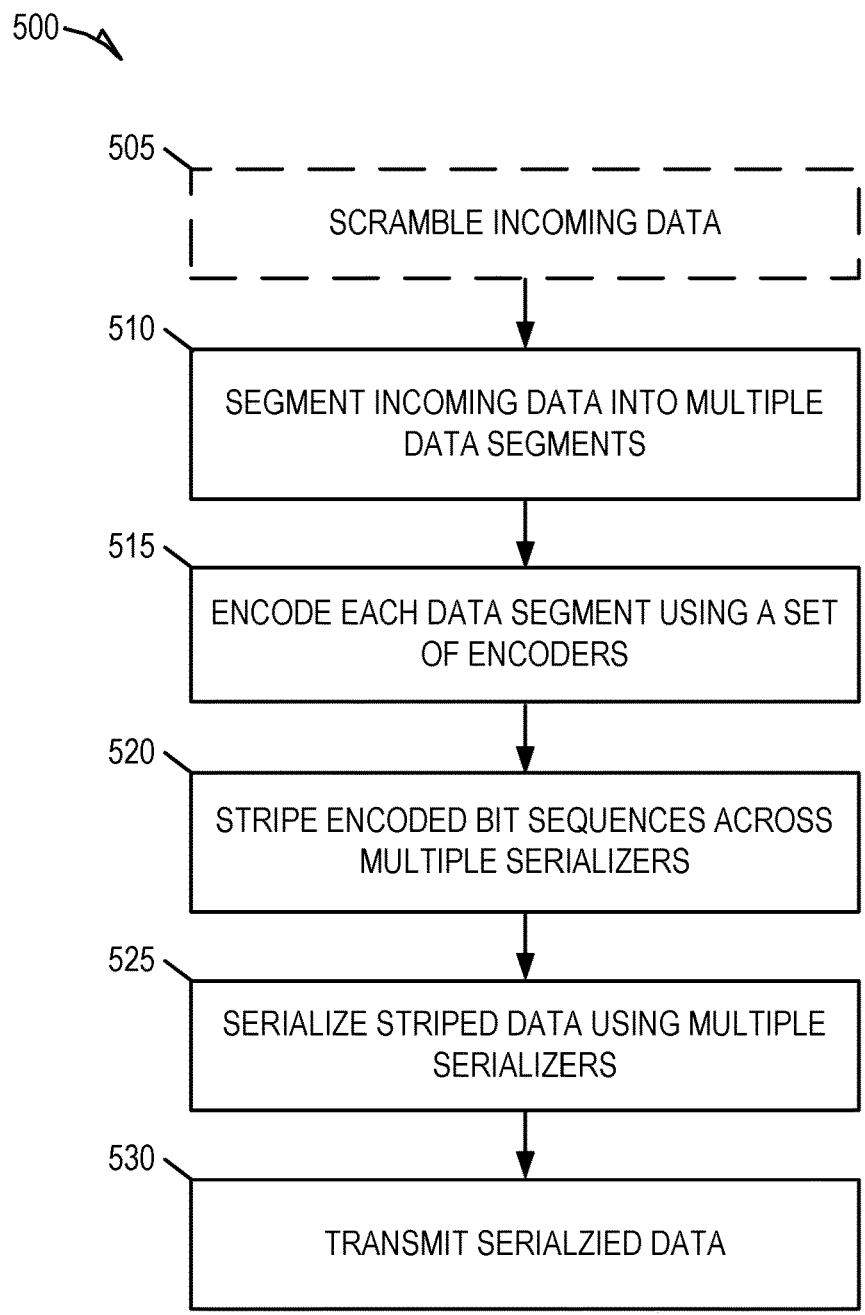
FIG. 5 is a flow diagram illustrating operations of the DC balancing sub-system in performing a method for encoding and striping transmit data in a PHY device, according to some example embodiments.

FIG. 5 is a flow diagram illustrating operations of the DC balancing sub-system in performing a method 500 for encoding and striping transmit data in a PHY device 100, according to some example embodiments. Depending on the embodiment, an operation of the method 500 may be repeated in different ways or involve intervening operations not shown. Though the operations of the method 500 may be depicted and described in a certain order, the order in which the operations are performed may vary among embodiments, including performing certain operations in parallel.

At operation 505, which is optional in some embodiments, the scrambler 400 scrambles incoming data. The scrambler 400 can scramble the incoming data by using the XOR gate 404 to perform an XOR on each bit of the incoming data with an associated bit from the LFSR 402, as noted above.

The incoming data is segmented into multiple data segments (operation 510) and each data segment is encoded by one of the encoders 202-1 to 202-L, at operation 515. In encoding a data segment, an encoder uses a predefined encoder scheme to translate the data segment into an encoded bit sequence that is DC balanced. The predefined encoder scheme comprises a mapping between unencoded bit sequences and encoded bit sequences, and the encoder translates the data segment into the encoded bit sequence based on the mapping.

At operation 520, the data striping component 204 stripes the set of encoded bit sequences across serializers 104-1 to 104-M. That is, the data striping component 204 distributes bits from the set of encoded bit sequences among the serializers 104-1 to 104-M. More specifically, the data striping component 204 routes individual bits to the serializers 104-1 to 104-M according to bit position. That is, each of the serializers 104-1 to 104-M is designated to receive a bit from a particular bit position in each of the encoded bit sequences. Each of the serializers 104-1 to 104-M receives an interleaved bit sequence comprising a single bit from each encoder 202.

At operation 525, the serializers 104-1 to 104-M serialize the stripped data, and at operation 530, the serialized data is transmitted to an RX PHY that is linked to the TX PHY 100. Each serializer 104 transmits serialized data in order such that the bit in first bit position of the interleaved bit sequence is transmitted first and the bit in the last position of the interleaved bit sequence is transmitted last.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
    a set of encoders to encode incoming data using a predefined encoder scheme, the incoming data being segmented into multiple data segments, each data segment comprising a first number of bits, the encoding of the incoming data comprising translating the multiple data segments into a set of balanced bit sequences, each balanced bit sequence comprising a second number of bits that is greater than the first number of bits;
    a data striping component to route the set of balanced bit sequences to a set of data serializers, the routing of the set of balanced bit sequences comprising routing a bit in a first bit position of each bit sequence in the set of bit sequences to a first serializer in the set of serializers; and
    a set of transmitters to transmit serialized data generated by the set of serializers based on the set of balanced bit sequences.

2. The system of claim 1, further comprising a scrambler to scramble the incoming data prior to encoding.

3. The system of claim 2, wherein the scrambler comprises:
    a logical exclusive or (XOR) gate and a linear feedback shift register (LFSR), the scrambler to scramble the incoming data by performing a logical XOR operation on each bit of the incoming data with a corresponding bit in a LFSR.

4. The system of claim 1, wherein each serializer in the set of serializers is designated to receive bits from a particular bit position in each balanced bit sequence.

5. The system of claim 1, wherein the predefined encoder scheme comprises a mapping between a set of unencoded bit sequences having the first number of bits and a set of encoded bit sequences having the second number of bits.

6. The system of claim 1, wherein a difference between a number of high state bits and a number of low state bits in each balanced bit sequence is no greater than two.

7. The system of claim 1, wherein the set of serializers comprises the second number of serializers.

8. The system of claim 1, a number of data segments in the set of data segments is the same as a number of encoders in the set of encoders.

9. The system of claim 1, wherein:
the first number of bits comprises 6-bits; and
the second number of bits comprises 7-bits.

10. A method comprising:
encoding incoming data using a predefined encoder scheme, the incoming data being segmented into multiple data segments, each data segment comprising a first number of bits, the encoding of the incoming data comprising translating, by a set of encoders, the multiple data segments into a set of balanced bit sequences, each balanced bit sequence comprising a second number of bits that is greater than the first number of bits,
distributing, by a data striping component, the set of balanced bit sequences to a set of data serializers, the distributing of the set of balanced bit sequences comprising routing a bit in a first bit position of each bit sequence in the set of bit sequences to a first serializer in the set of serializers; and
transmitting serialized data generated by the set of serializers based on the set of balanced bit sequences.

11. The method of claim 10 comprising, prior to encoding the incoming data, scrambling the incoming data.

12. The method of claim 11, wherein the scrambling of the incoming data comprises:
performing a logical exclusive OR (XOR) operation on each bit of the incoming data with a corresponding bit in a linear feedback shift register (LF SR).

13. The method of claim 10, wherein each serializer in the set of serializers is designated to receive bits from a particular bit position in each balanced bit sequence.

14. The method of claim 10, wherein the predefined encoder scheme comprises a mapping between a set of unencoded bit sequences having the first number of bits and a set of encoded bit sequences having the second number of bits.

15. The method of claim 10, wherein a difference between a number of high state bits and a number of low state bits in each balanced bit sequence is no greater than two.

16. The method of claim 10, wherein the set of serializers comprises the second number of serializers.

17. The method of claim 10, a number of data segments in the set of data segments is the same as a number of encoders in the set of encoders.

18. The method of claim 10, wherein:
the first number of bits comprises 6-bits; and
the second number of bits comprises 7-bits.

19. A direct current (DC) balancing sub-system for single-ended signaling, the DC balancing sub-system comprising:
a set of encoders to encode an input data word using a predefined encoder scheme, the input data word being segmented into multiple 6-bit data segments, the encoding of the input data word comprising translating the multiple 6-bit data segments into a set of balanced 7-bit sequences, a difference between a number of high state bits and a number of low state bits in each balanced 7-bit sequence being no greater than 1; and
a data striping component to route the set of balanced 7-bit sequences to a set of data serializers, the routing of the set of balanced 7-bit sequences comprising routing a bit in a first bit position of each 7-bit sequence in the set of 7-bit sequences to a first serializer in the set of serializers.

20. The DC balancing sub-system of claim 19, wherein the predefined encoder scheme comprises a mapping between 6-bit unencoded sequences and 7-bit encoded symbols.

* * * * *